(12) United States Patent
Oh et al.

(10) Patent No.: US 12,269,057 B2
(45) Date of Patent: Apr. 8, 2025

(54) APPARATUS AND METHOD FOR PROCESSING SUBSTRATE

(71) Applicant: SEMES CO., LTD., Chungcheongnam-do (KR)

(72) Inventors: Young Kyu Oh, Chungcheongnam-do (KR); Jung Soo Lee, Chungcheongnam-do (KR); Chung Oh Hong, Daejeon (KR); Chang Hwa Jeong, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/946,027

(22) Filed: Sep. 15, 2022

(65) Prior Publication Data
US 2023/0191447 A1    Jun. 22, 2023

(30) Foreign Application Priority Data

Dec. 17, 2021   (KR) .......................... 10-2021-0181800

(51) Int. Cl.
*B05D 1/30*   (2006.01)
*B05C 11/10*  (2006.01)
*B05C 13/00*  (2006.01)

(52) U.S. Cl.
CPC ............ *B05D 1/30* (2013.01); *B05C 11/1005* (2013.01); *B05C 13/00* (2013.01)

(58) Field of Classification Search
CPC ....... B05D 1/30; B05C 11/1005; B05C 13/00; H01L 21/67294; H01L 21/6776; H01L 21/67784; H01L 21/67706; G03F 7/70716; G03F 7/16; G03F 7/70725; G03F 7/70991; B65G 49/061; B65G 51/03; B65G 2201/022

See application file for complete search history.

(56) References Cited

U.S. PATENT DOCUMENTS

2009/0165711 A1*   7/2009   Ogura ................. H01L 21/6776
                                                              118/600

FOREIGN PATENT DOCUMENTS

| JP | 2008-166348   | 7/2008 |
| JP | 2010-126295   | 6/2010 |
| JP | 2010126295 A * | 6/2010 |

(Continued)

OTHER PUBLICATIONS

Office Action dated Nov. 25, 2023 for Korean Patent Application No. 10-2021-0181800 and its English translation from Global Dossier.

(Continued)

*Primary Examiner* — Alexander M Weddle
(74) *Attorney, Agent, or Firm* — WOMBLE BOND DICKINSON (US) LLP

(57) ABSTRACT

An apparatus for processing a substrate is provided. The apparatus includes: a levitation stage transferring a substrate in a first direction and including first areas and second areas, which are arranged in a second direction that is different from the first direction; a plurality of rollers installed in the first areas and transferring the substrate; a plurality of first vacuum holes installed in the first areas and sucking the air at first pressure; and a plurality of second vacuum holes installed in the second areas and sucking the air at second pressure that is different from the first pressure.

17 Claims, 10 Drawing Sheets

(56) References Cited

FOREIGN PATENT DOCUMENTS

| JP | 2012190890 A | * | 10/2012 | ........... B65G 49/061 |
|----|--------------|---|---------|------------------------|
| KR | 10-2008-0061298 | | 7/2008 | |
| KR | 10-2010-0031453 | | 3/2010 | |
| KR | 10-2011-0058040 | | 6/2011 | |
| KR | 10-2012-0103487 | | 9/2012 | |

OTHER PUBLICATIONS

Office Action dated Nov. 28, 2023 for Japanese Patent Application No. 2022-172263 and its English translation from Global Dossier.
Notice of Allowance dated Aug. 29, 2024 for Korean Patent Application No. 10-2021-0181800 and its English translation from Global Dossier.

* cited by examiner

APPARATUS AND METHOD FOR PROCESSING SUBSTRATE

CROSS-REFERENCE TO RELATED APPLICATION

This application claims priority from Korean Patent Application No. 10-2021-0181800 filed on Dec. 17, 2021 in the Korean Intellectual Property Office, and all the benefits accruing therefrom under 35 U.S.C. 119, the contents of which in its entirety are herein incorporated by reference.

BACKGROUND

1. Field

The present disclosure relates to an apparatus and method for processing a substrate.

2. Description of the Related Art

During the fabrication of a display device, various processes such as photolithography, etching, ashing, ion implantation, thin-film deposition, and rinsing are performed. Here, photolithography involves application, exposure, and development steps. Specifically, a photosensitive film is formed on a substrate in the application step, a circuit pattern is exposed on the substrate where the photosensitive film is formed, in the exposure step, and the substrate is selectively developed in the development step.

While these steps are being conducted, the substrate may be lifted up and then transferred with the use of a levitation stage. However, as various types of stages (e.g., substrates with different thicknesses or even warped substrates) are transferred via the levitation stage, transfer failure such as slips or misalignment often occur.

SUMMARY

Aspects of the present disclosure provide an apparatus for processing a substrate, which can stably transfer various types of substrates.

Aspects of the present disclosure also provide a method of processing a substrate, which can stably transfer various types of substrates.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, an apparatus for processing a substrate includes: a levitation stage transferring a substrate in a first direction and including first areas and second areas, which are arranged in a second direction that is different from the first direction; a plurality of rollers installed in the first areas and transferring the substrate; a plurality of first vacuum holes installed in the first areas and sucking the air at first pressure; and a plurality of second vacuum holes installed in the second areas and sucking the air at second pressure that is different from the first pressure.

According to another aspect of the present disclosure, an apparatus for processing a substrate includes: a levitation stage transferring a substrate in a first direction and including first areas and second areas, which are alternately arranged in a second direction that is different from the first direction; a plurality of rollers installed in the first areas and transferring the substrate; a plurality of first vacuum holes installed in the first areas and sucking the air at first pressure; a plurality of first spray holes installed in the areas and spraying compressed air; a plurality of second vacuum holes installed in the second areas and sucking the air at second pressure; a plurality of second spray holes installed in the areas and spraying compressed air; and a controller controls a magnitude of the first pressure depending on a thickness of the substrate and controls a magnitude of the second pressure depending on a type of film formed on the substrate.

According to another aspect of the present disclosure, a method of processing a substrate includes: providing an apparatus for processing a substrate, the apparatus including a levitation stage, which includes first areas and second areas that are arranged along a width direction, a plurality of rollers, which are installed in the first areas and are for transferring a substrate, a plurality of first vacuum holes, which are installed in the first areas and suck the air at first pressure, a plurality of second vacuum holes, which are installed in the second areas and suck the air at second pressure, and a controller, which controls the first and second pressures; receiving a unique identifier of the substrate; introducing the substrate onto the levitation stage; acquiring information regarding a thickness of the substrate and a type of film formed on the substrate based on the identifier; and controlling a magnitude of the first pressure based on the thickness of the substrate and controlling a magnitude of the second pressure based on the type of film formed on the substrate.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
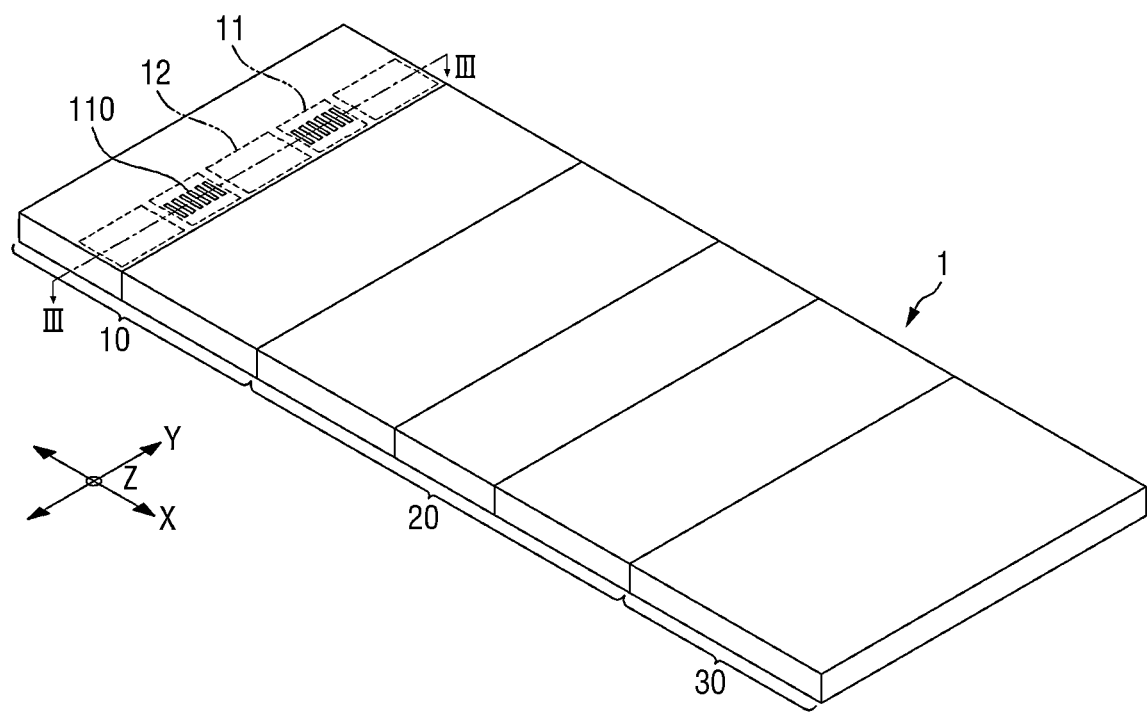
FIG. 1 is a perspective view of an apparatus for processing a substrate according to a first embodiment of the present disclosure.

Embodiments of the present disclosure will hereinafter be described with reference to the accompanying drawings.

Advantages and features of the present disclosure and a method of achieving the same should become clear with embodiments described in detail below with reference to the accompanying drawings. However, the present disclosure is not limited to the embodiments disclosed below and may be realized in various other forms. The present embodiments make the disclosure complete and are provided to completely inform one of ordinary skill in the art to which the present disclosure pertains of the scope of the disclosure. The present disclosure is defined only by the scope of the claims. Like reference numerals refer to like elements throughout.

Spatially relative terms such as "below", "beneath", "lower", "above" or "upper" may be used herein to describe one element's relationship to another element as illustrated in the accompanying drawings. It will be understood that spatially relative terms are intended to encompass different orientations of the device in addition to the orientation depicted in the drawings. For example, if the device in one of the drawings is turned over, elements described as "below" or "beneath" other elements would then be oriented "above" the other elements. The exemplary terms "below" or "beneath" can, therefore, encompass both an orientation of above and below. Since the device may be oriented in another direction, the spatially relative terms may be interpreted in accordance with the orientation of the device.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Embodiments of the present disclosure will hereinafter be described with reference to the accompanying drawings. Like reference numerals indicate like elements through the present disclosure, and thus, detailed descriptions thereof will be omitted.

FIG. 1 is a perspective view of an apparatus for processing a substrate according to a first embodiment of the present disclosure.

Referring to FIG. 1, the apparatus includes a levitation stage 1, which extends in a first direction (e.g., an X-axis direction).

The levitation stage 1 includes an in-stage 10 on which a substrate is introduced, a precision stage 20 on which a process is performed on the substrate, and an out-stage 30 from which the substrate exits when the process is complete.

As the substrate is processed on the precision stage 20, the position of the substrate needs to be controlled with precision. Thus, air holes for spraying compressed air to float the substrate and vacuum holes for accurately positioning the substrate by sucking the air. Here, the process may be a process of applying a photosensitive film or an antireflection film on the substrate, but the present disclosure is not limited thereto.

As will be described later, the in-stage 10 includes a plurality of first areas 11 and a plurality of second areas 12. The first areas 11 and the second areas 12 may be arranged in the first direction and a second direction (e.g., a Y-axis direction), which is different from the first direction. The first areas 11 and the second areas 12 may be alternately arranged. FIG. 1 illustrates that two first areas 11 and three second areas 12 are provided, but the present disclosure is not limited thereto. That is, three or more first areas 11 may be provided, and second areas 12 may be disposed between the three or more first areas 11.

Figure 2:
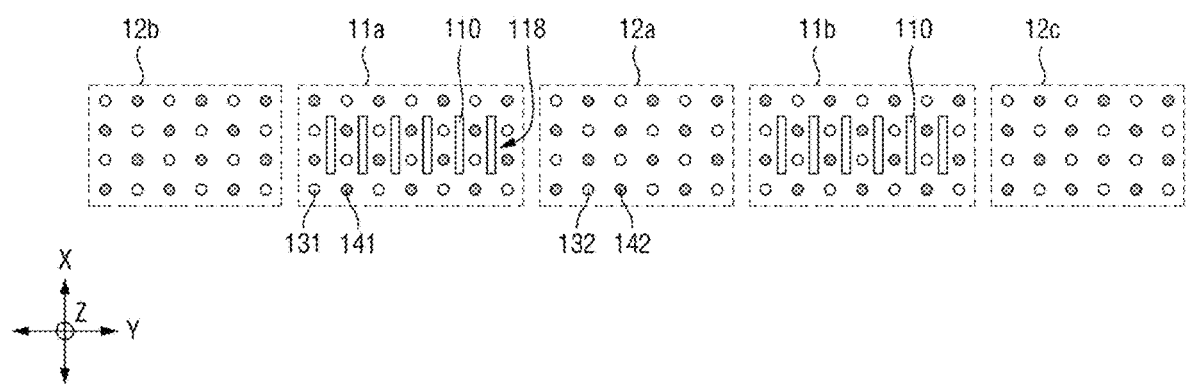
FIG. 2 is a plan view illustrating first areas and second areas of FIG. 1.
Figure 3:
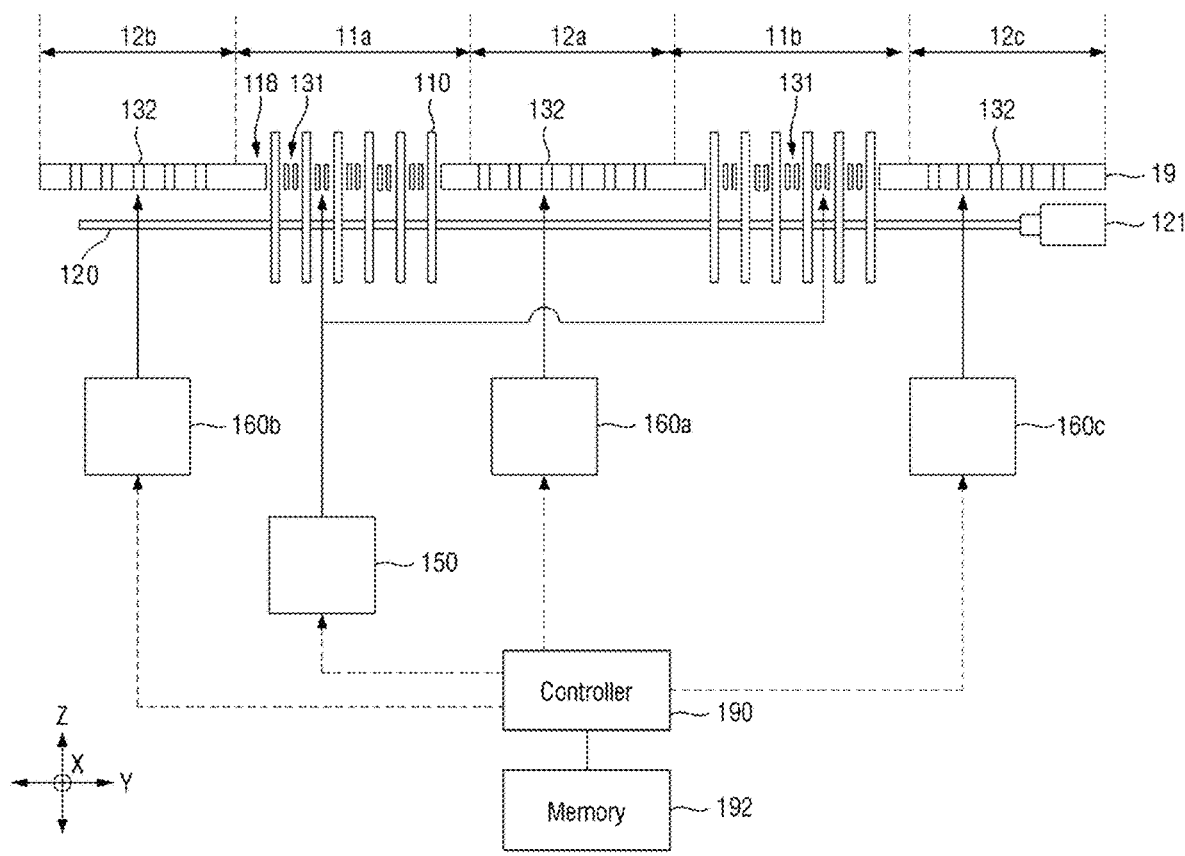
FIG. 3 is a cross-sectional view taken along line III-III of FIG. 1.
Figure 4:
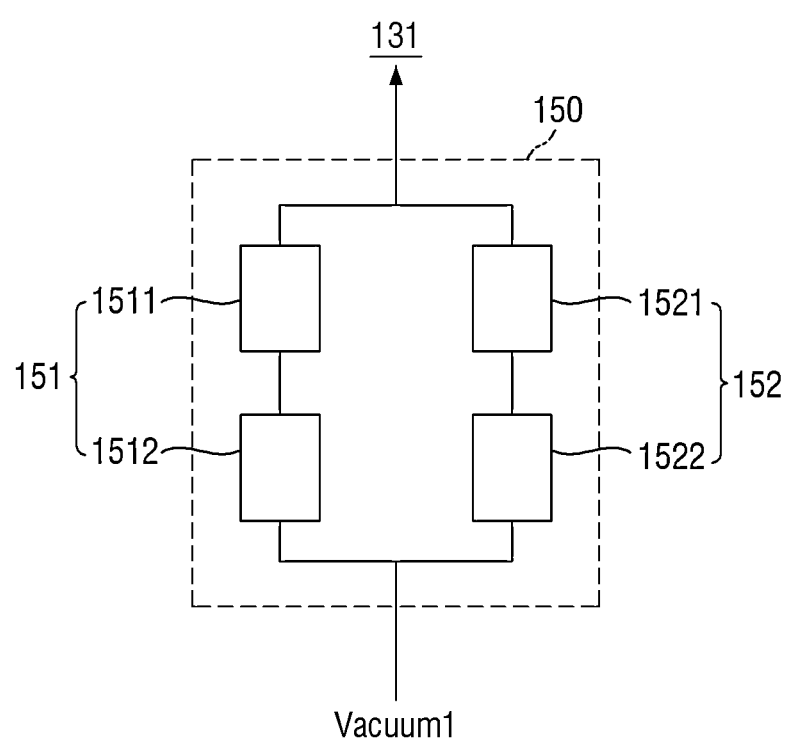
FIG. 4 illustrates a first valve module of FIG. 3.
Figure 5:
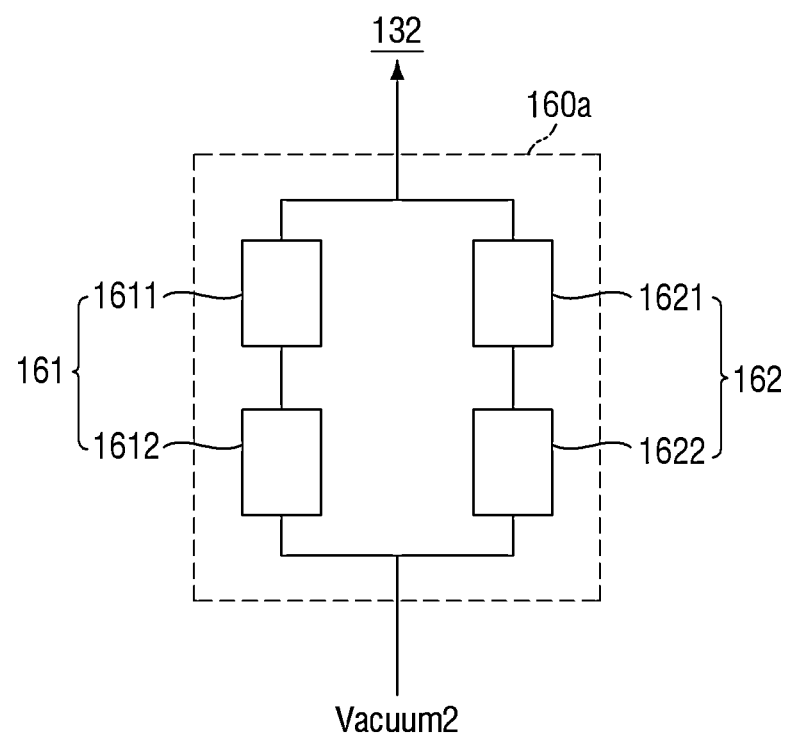
FIG. 5 illustrates a second valve module of FIG. 3.

FIG. 2 is a plan view illustrating the first areas and the second areas of FIG. 1. FIG. 3 is a cross-sectional view taken along line III-III of FIG. 1. FIG. 4 illustrates a first valve module of FIG. 3. FIG. 5 illustrates a second valve module of FIG. 3.

Referring to FIGS. 2 and 3, the first areas 11a, 11b and the second areas 12a, 12b, 12c may be arranged in the second direction. Specifically, a second area 12b, a first area 11a, a second area 12a, a first area 11b, and a second area 12c may be sequentially arranged along the second direction.

A plurality of through holes 118, a plurality of first vacuum holes 131, a plurality of first spray holes 141, a plurality of second spray holes 132, and a plurality of second spray holes 142 may be formed on a base plate 19.

A plurality of rollers 110 for transferring a substrate are disposed in the first areas 11. The rollers 110 penetrate the through holes 118 in a third direction (e.g., a Z-axis direction) and are thus exposed on the top surface of the base plate 19. The rollers 110 are connected do a driving shaft 120, and the driving shaft 120 is connected to a driving motor 121. Thus, the driving shaft 120 is rotated by a rotational force from the driving motor 121, and as a result, the rollers 110 are rotated.

The first spray holes 141 and the first vacuum holes 131 may be further disposed in the first areas 11.

The distance between the substrate and the base plate 19 is controlled by spraying compressed air through the first spray holes 141. The first spray holes 141 and a valve module for controlling the first spray holes 141 are not illustrated in FIG. 3.

The first vacuum holes 131 are for sucking the air at first pressure. The first vacuum holes 131 suck the air at the first pressure such that the substrate is placed in contact with the rollers 110. Accordingly, the substrate can be easily transferred in the first direction by rotating the rollers 110. The first pressure may be controlled depending on the thickness of the substrate.

Specifically, a first valve module 150 is installed to correspond to the first areas 11. That is, the first valve module 150 is fluidly connected to the first vacuum holes 131, which are installed in the first areas 11. The first valve module 150 may control the magnitude of the first pressure to be provided to the first vacuum holes 131, under the control of a controller 190.

A memory 192 may store first pressure magnitudes for different substrate thicknesses. The controller 190 may calculate corresponding the first pressure magnitude based on the thickness of the substrate from the memory 192. The controller 190 may control the first valve module 150 based on the calculated first pressure.

Referring to FIG. 4, the first valve module 150 includes a plurality of first valve units 151 and 152. FIG. 4 illustrates that the first valve module 150 includes two first valve units, i.e., the first valve units 151 and 152, but the present disclosure is not limited thereto.

The first valve unit 151 includes, for example, a solenoid valve 1511 and a flow control valve 1512. The first valve unit 152 includes, for example, a solenoid valve 1521 and a flow control valve 1522. The flow control valves 1512 and 1522 are set in advance to different flow rates. That is, the flow control valves 1512 and 1522 are set in advance to different opening/closing amounts. The flow control valves 1512 and 1522 are turned on or off under the control of the controller 190.

If the substrate has a first thickness, the controller 190 turns on the solenoid valve 1511 and provides a first pressure having a first magnitude set by the flow control valve 1512 to the first vacuum holes 131.

If the substrate has a second thickness, the controller 190 turns on the solenoid valve 1521 and provides a first pressure having a second magnitude set by the flow control valve 1522 to the first vacuum holes 131.

Referring again to FIGS. 2 and 3, the second spray holes 142 and the second vacuum holes 132 are disposed in the second areas 12.

The distance between the substrate and the base plate 19 is controlled by spraying compressed air through the second spray holes 142. The second spray holes 142 and a valve module for controlling the second spray holes 142 are not illustrated in FIG. 3.

The second vacuum holes 132 are for sucking the air at second pressure. The second pressure may be controlled depending on the thickness of a film formed on the substrate, and this will be described later with reference to FIG. 8. The second pressure may be controlled differently and independently from the first pressure.

The magnitude of the second pressure may differ from the second area 12a to the second area 12b to the second area 12c. Specifically, second valve modules 160a, 160b, and 160c are installed to correspond to the second areas 12a, 12b, and 12c, respectively. For example, the second valve module 160a is fluidly connected to second vacuum holes 132 installed in the second area 12a, the second valve module 160b is fluidly connected to second vacuum holes 132 installed in the second area 12b, and the second valve module 160c is fluidly connected to second vacuum holes 132 installed in the second area 12c. The second valve modules 160a, 160b, and 160c may control the magnitude of the second pressure under the control of the controller 190.

The memory 192 may store, for example, second pressure magnitudes corresponding to various types of films that can be formed on the substrate. The controller 190 may calculate a second pressure to be provided, based on the second pressure magnitudes stored in the memory 192 and the type of film formed on the substrate. The controller 190 controls the second valve modules 160a, 160b, and 160c based on the calculated second pressure. For example, the second valve module 160a may provide a second pressure having a third magnitude, and the second valve modules 160b and 160c may provide a second pressure having a fourth magnitude, which is greater than the third magnitude. In another example, the second valve module 160a may provide a second pressure having the fourth magnitude, and the second valve modules 160b and 160c may provide a second pressure having the third magnitude.

Referring to FIG. 5, the second valve module 160a includes a plurality of second valve units 161 and 162, which are arranged in parallel to each other. FIG. 5 illustrates that the second valve module 160a includes two second valve units, i.e., the second valve units 161 and 162, but the present disclosure is not limited thereto.

The second valve unit 161 includes, for example, a solenoid valve 1611 and a flow control valve 1612. The second valve unit 162 includes, for example, a solenoid valve 1621 and a flow control valve 1622. The flow control valves 1612 and 1622 are set in advance to different flow rates. That is, the flow control valves 1612 and 1622 are set in advance to different opening/closing amounts. The flow control valves 1612 and 1622 are turned on or off under the control of the controller 190.

If the film formed on the substrate is a first type of film such as, for example, a nonmetal film or an insulating film, the controller 190 turns on the solenoid valve 1611 such that a second pressure having the fourth magnitude set by the flow control valve 1612 is provided to the second vacuum holes 132.

If the film formed on the substrate is a second type of film such as, for example, a metal film, the controller 190 turns on the solenoid valve 1621 such that a second pressure having the third magnitude set by the flow control valve 1622 is provided to the second vacuum holes 132.

The second valve modules 160b and 160c have substantially the same configuration as that illustrated in FIG. 5.

Figure 6:
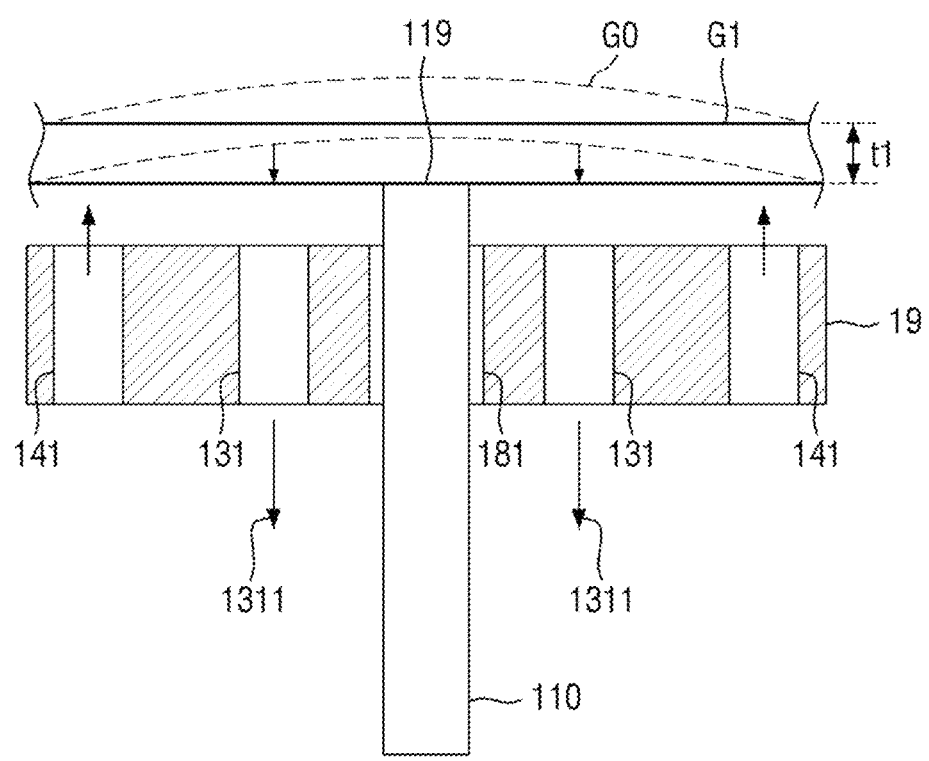
FIGS. 6 and 7 are cross-sectional views illustrating a first operation of the apparatus of FIG. 1.
Figure 7:
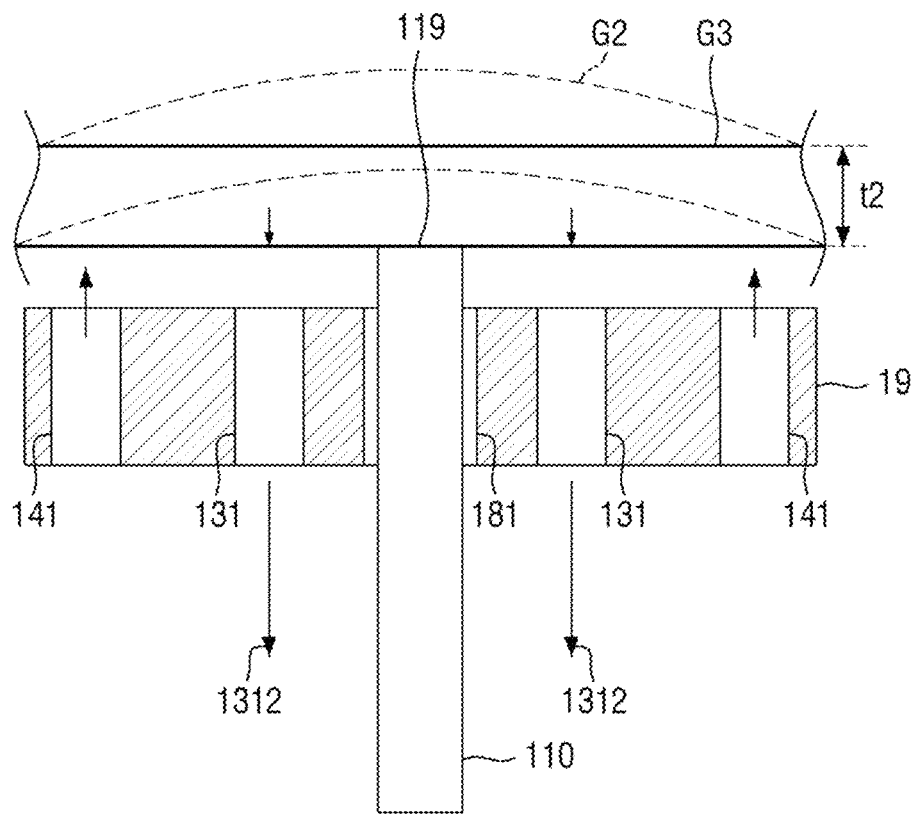

FIGS. 6 and 7 are cross-sectional views illustrating a first operation of the apparatus of FIG. 1.

Referring to FIG. 6, it is assumed that a substrate G1 has a first thickness t1.

The first spray holes 141 float the substrate G1 by spraying compressed air.

The first vacuum holes 131 place the substrate G1 in contact with the rollers 110, as indicated by reference numeral 119, by sucking the air at a first pressure having the first magnitude, as indicated by reference numeral 1311.

If there are no first vacuum holes 131, there may exist a gap (of, for example, 100 μm to 200 μm) between a substrate G0 and the rollers 110 so that the rotational force from the rollers 110 may not be delivered to the substrate G0.

However, as the first vacuum holes 131 suck the air at the first pressure having the first magnitude, the rotational force from the rollers 110 can be stably delivered to the substrate G0.

On the contrary, if the first vacuum holes 131 suck the air at a first pressure having the second magnitude, which is greater than the first magnitude, the substrate G1 may be pushed too hard against the base plate 19 and may thus not be able to properly move.

Thereafter, referring to FIG. 7, it is assumed that a substrate G3 has a second thickness t2, which is greater than the first thickness t1.

The first vacuum holes 131 place the substrate G3 in contact with the rollers 110 by sucking the air at a first pressure having the second magnitude, which is greater than the first magnitude, as indicated by reference numeral 1312.

If there are no first vacuum holes 131, there may exist a gap between a substrate G2 and the rollers 110. Also, if the first vacuum holes 131 suck the air at a first pressure having the first magnitude, rather than the second magnitude, the substrate G2 may not be able to be placed in contact with the rollers 110. That is, the thicker the substrate G2, the higher the pressure at which first vacuum holes 131 suck the air to float the substrate G2.

In short, the magnitude of the pressure provided to the first vacuum holes 131 varies depending on the thickness of the substrate G1 or G3, as indicated by reference numerals 1311 and 1312. That is, the thicker the substrate G1 or G3, the higher the pressure provided to the first vacuum holes 131. By controlling the pressure provided to the first vacuum holes 131, the substrates G1 and G3 can be stably transferred with the use of the rollers 110.

Figure 8:
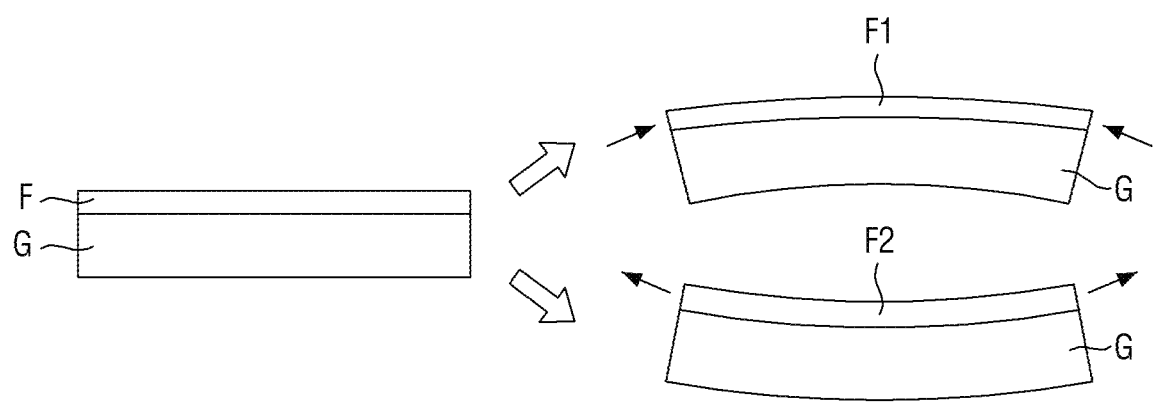
FIG. 8 is a cross-sectional view illustrating a second operation of the apparatus of FIG. 1.

FIG. 8 is a cross-sectional view illustrating a second operation of the apparatus of FIG. 1.

Referring to FIG. 8, a film F is formed on a substrate G. The direction in which the substrate G warps may vary depending on the type of the film F.

For example, if a nonmetal film F1 is formed on the substrate G, the substrate G may warp upwardly so that a center area of the substrate G may be positioned higher than edge areas of the substrate G, because the nonmetal film F1 applies compressive stress to the substrate G.

On the contrary, if a metal film F2 is formed on the substrate G, the substrate G may warp downwardly so that the edge areas of the substrate G may be positioned higher than the center area of the substrate G, because the metal film F2 applies tensile stress to the substrate G.

Referring to FIGS. 3 and 8, the magnitude of the second pressure may differ from the second area 12a to the second area 12b to the second area 12c.

For example, if the nonmetal film F1 is formed on the substrate G, the magnitude of the second pressure provided to the second area 12a, which corresponds to the center area of the substrate G, i.e., the fourth magnitude, may be greater than the magnitude of the second pressure provided to the second areas 12b and 12c, which correspond to the edge areas of the substrate G, i.e., the third magnitude.

Accordingly, the second areas 12a, 12b, and 12c can pull the center area of the substrate G harder than the edge areas of the substrate G.

For example, if the metal film F2 is formed on the substrate G, the magnitude of the second pressure provided to the second areas 12b and 12c, which correspond to the edge areas of the substrate G, i.e., the fourth magnitude, may be greater than the magnitude of the second pressure provided to the second area 12a, which corresponds to the center area of the substrate G, i.e., the third magnitude.

Accordingly, the second areas 12a, 12b, and 12c can pull the edge areas of the substrate G harder than the center area of the substrate G.

In short, the magnitude of the first pressure provided to the first vacuum holes 131, near the rollers 110, may be controlled differently depending on the thickness of the substrate G. Also, the magnitude of the second pressure provided to the second vacuum holes 132 may be controlled differently depending on the type of film formed on the substrate G. In this manner, the adhesion force for the substrate G can be optimized. Therefore, failure to transfer the substrate G over the levitation stage 1 can be minimized.

Figure 9:
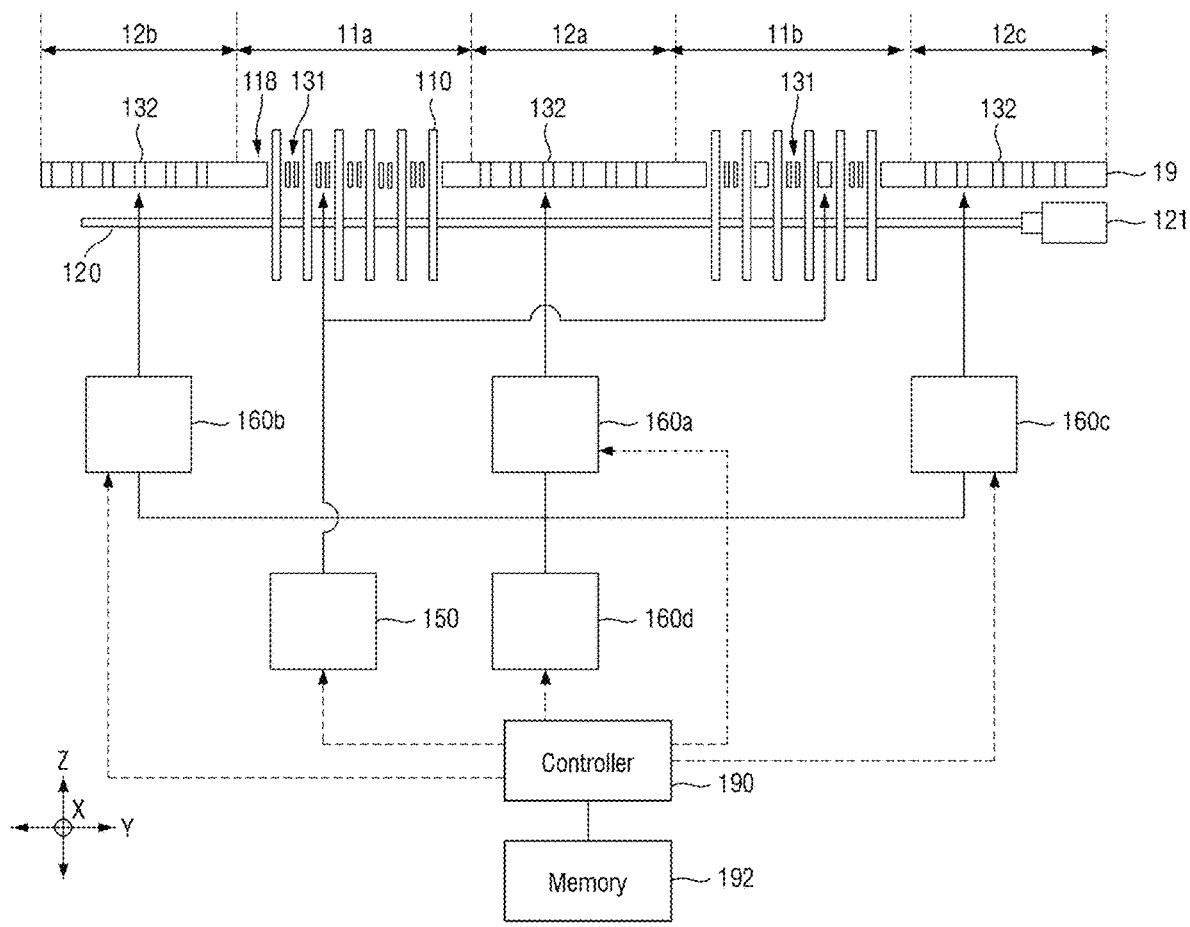
FIG. 9 illustrates an apparatus for processing a substrate according to a second embodiment of the present disclosure.

FIG. 9 illustrates an apparatus for processing a substrate according to a second embodiment of the present disclosure. For convenience, descriptions of elements or features that have already been described above with reference to FIGS. 1 through 8 will be omitted.

Referring to FIG. 9, the apparatus includes a plurality of second valve modules 160a, 160b, and 160c, which are installed to correspond to a plurality of second areas 12a, 12b, and 12c, respectively, and a third valve module 160d, which corresponds to the second valve modules 160a, 160b, and 160c. A plurality of second vacuum holes 132 of the second areas 12a, 12b, and 12c are controlled using two-stage valve modules (160a, 160b, 160c, and 160d).

As already mentioned above, each of the second valve modules 160a, 160b, and 160c may include a plurality of second valve units (161 and 162 of FIG. 5), which are arranged in parallel to each other. The second valve units may be set to different opening/closing amounts.

Although not specifically illustrated, the third valve module 160d, like the second valve modules 160a, 160b, and 160c, may include a plurality of third valve units, which are arranged in parallel to each other. The third valve units may be set to different opening/closing amounts.

In this manner, the magnitude of pressure to be provided to the second vacuum holes 132 of the second areas 12a, 12b, and 12c can be controlled in various manners. For example, if the second valve module 160a is set to one of two opening/closing amounts and the third valve module 160d is set to one of two opening/closing amounts, the pressure to be provided to the second vacuum holes 132 of the second area 12a may be determined by one of the four opening/closing amounts (∵2×2=4).

Various types of films may be formed on a substrate. For example, a nonmetal film (e.g., the nonmetal film F1 of FIG. 8) may include an oxide, a nitride, a high-k material, or the like. The level of compressive stress applied to a substrate varies depending on the type of nonmetal film formed on the substrate, and as a result, the degree to which the substrate warps also varies. A metal film (e.g., the metal film F2 of FIG. 8) may include copper (Cu), aluminum (Al), titanium (Ti), or the like. The level of tensile stress applied to a substrate varies depending on the type of metal film formed on the substrate, and as a result, the degree to which the substrate warps also varies. Accordingly, three or more magnitudes of pressure need to be provided to the second vacuum holes 132 of the second areas 12a, 12b, and 12c.

In the embodiment of FIG. 9, three or more magnitudes of pressure can be provided to the second vacuum holes 132 by arranging the valve modules 160a, 160b, 160c, and 160d in two or more stages.

Figure 10:
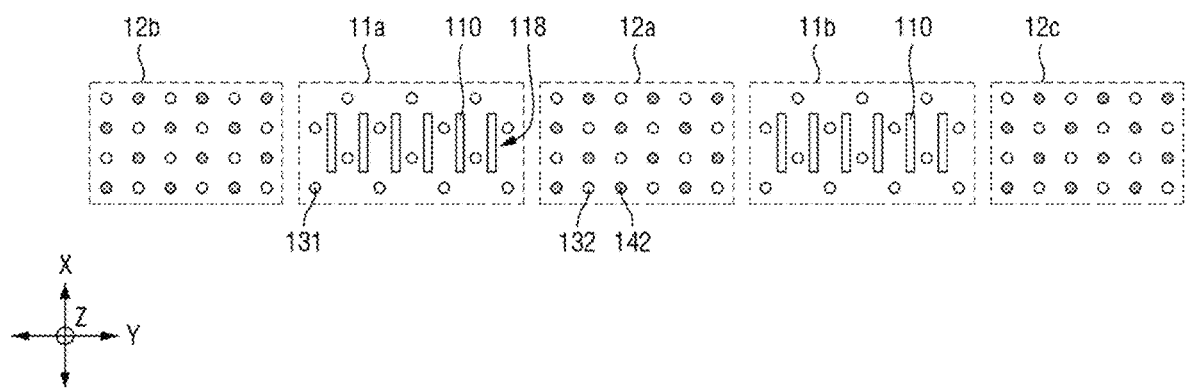
FIG. 10 illustrates an apparatus for processing a substrate according to a third embodiment of the present disclosure.

FIG. 10 illustrates an apparatus for processing a substrate according to a third embodiment of the present disclosure. For convenience, descriptions of elements or features that have already been described above with reference to FIGS. 1 through 8 will be omitted.

Referring to FIG. 10, a plurality of first areas 11a and 11b and a plurality of second areas 12a, 12b, and 12c are arranged in a second direction (e.g., a Y-axis direction).

A plurality of rollers 110 for transferring a substrate and a plurality of first vacuum holes 131 for sucking the air at first pressure are formed in the first areas 11a and 11b. No first spray holes are formed in the first areas 11a and 11b.

A plurality of second vacuum holes 132 for sucking the air at second pressure and a plurality of second spray holes 142 for spraying compressed air are formed in the second areas 12a, 12b, and 12c.

Figure 11:
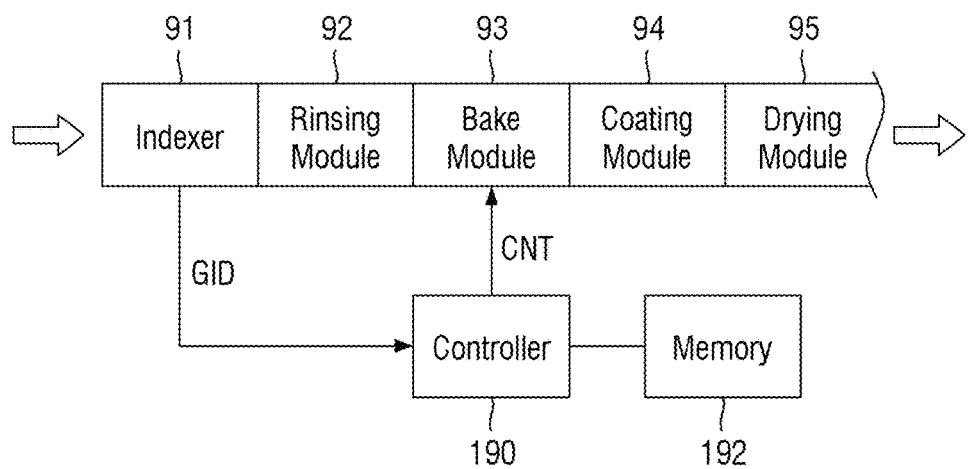
FIG. 11 illustrates an apparatus for processing a substrate according to a fourth embodiment of the present disclosure.

FIG. 11 illustrates an apparatus for processing a substrate according to a fourth embodiment of the present disclosure.

Referring to FIG. 11, an indexer 91, a rinsing module 92, a bake module 93, a coating module 94, and a drying module 95 may be sequentially disposed in the apparatus. A substrate may be delivered sequentially to the indexer 91, the rinsing module 92, the bake module 93, the coating module 94, and the drying module 95 and may be subjected to processes corresponding to the indexer 91, the rinsing module 92, the bake module 93, the coating module 94, and the drying module 95.

When the substrate is introduced into the indexer 91, the indexer 91 recognizes a unique identifier GID of the substrate. The identifier GID of the substrate is provided to a controller 190.

Thereafter, the substrate is delivered to the rinsing module 92 and is then rinsed with a rinsing solution.

Thereafter, the substrate is delivered to the bake module 93 and is then baked to remove any remaining rinsing solution.

Thereafter, the substrate is delivered to the coating module 94. The coating module 94 may be an air floating coater. At least one of the apparatuses described above with reference to FIGS. 1 through 10 may be applicable to the coating module 94.

Specifically, the substrate is introduced onto, for example, the levitation stage 1 of FIG. 1. The controller 190 acquires information on the thickness of the substrate and the type of film formed on the substrate, based on the identifier GID. The controller 190 controls the magnitude of first pressure to be provided to, for example, the first vacuum holes 131 in the first areas 11a and 11b of FIG. 3, based on the thickness of the substrate. Also, the controller 190 controls the magnitude of second pressure to be provided to, for example, the second vacuum holes 132 in the second areas 12a, 12b, and 12c of FIG. 3, based on the type of film formed on the substrate.

Thereafter, the substrate is delivered to the drying module 95. Then, the film coated on the substrate is dried.

Figure 12:
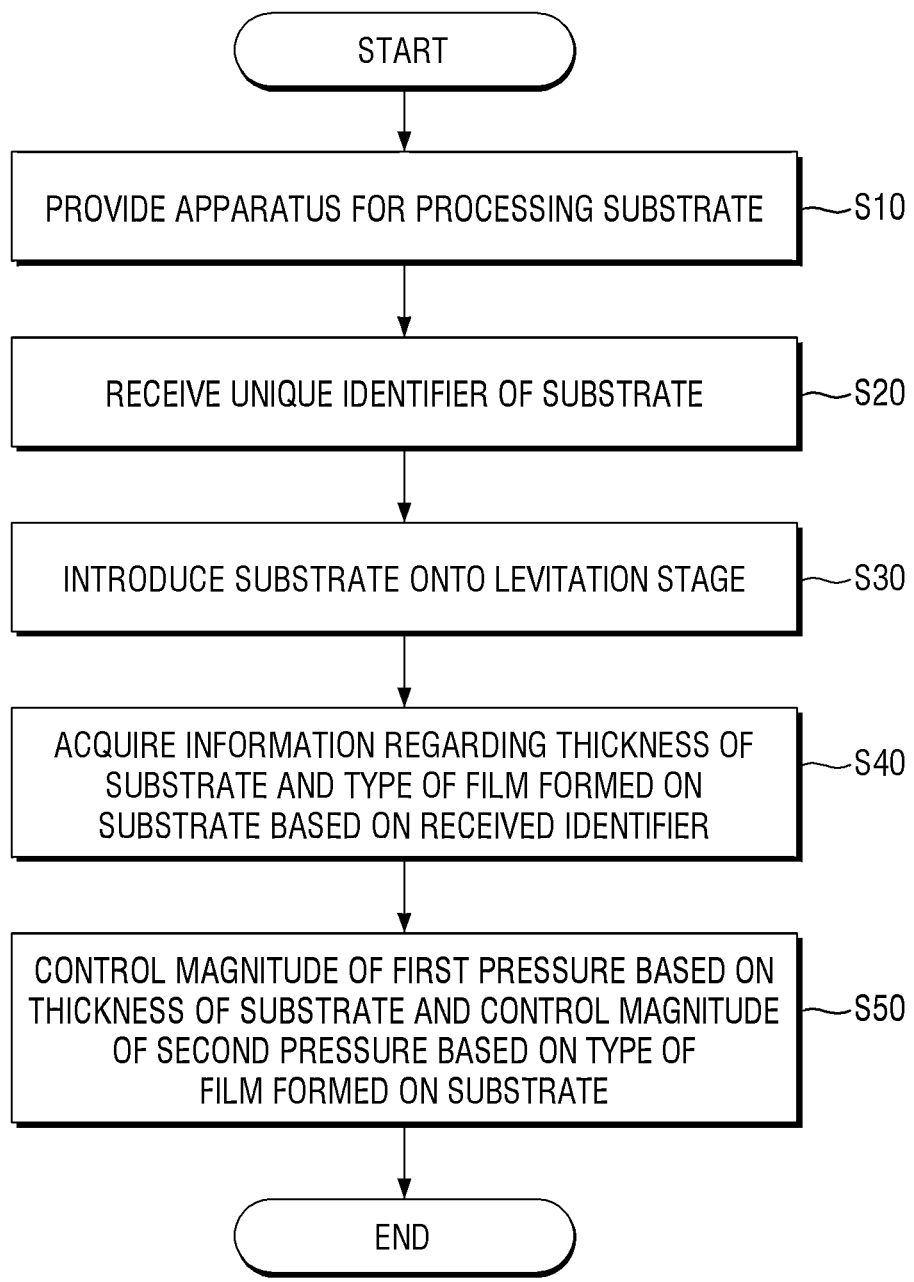
FIG. 12 is a flowchart illustrating a method of processing a substrate according to some embodiments of the present disclosure.

FIG. 12 is a flowchart illustrating a method of processing a substrate according to some embodiments of the present disclosure. For convenience, descriptions of elements or features that have already been described above with reference to FIGS. 1 through 8 will be omitted.

Referring to FIGS. 1 through 3 and 12, an apparatus for processing a substrate is provided (S10). Specifically, the apparatus includes a levitation stage 1, which includes first areas 11a and 11b and second areas 12a, 12b, and 12c that are arranged along a width direction, a plurality of rollers 110, which are installed in the first areas 11a and 11b and are for transferring a substrate, a plurality of first vacuum holes 131, which are installed in the first areas 11a and 11b and suck the air at first pressure, a plurality of second vacuum holes 132, which are installed in the second areas 12a, 12b, and 12c and suck the air at second pressure, and a controller 190, which controls the first and second pressures.

Thereafter, a unique identifier (see GID of FIG. 11) of a substrate is provided (S20). Specifically, the controller 190 receives the identifier GID of the substrate from, for example, the indexer 91 of FIG. 11.

Thereafter, the substrate is introduced onto the levitation stage 1 (S30).

Thereafter, information regarding the thickness of the substrate and the type of film formed on the substrate is required based on the identifier of the substrate (S40). That is, the controller 190 acquires the information regarding the thickness of the substrate and the type of film formed on the substrate from, for example, a memory 192 of FIG. 11, based on the identifier GID of the substrate.

Thereafter, the magnitude of the first pressure is controlled based on the thickness of the substrate, and the magnitude of the second pressure is controlled based on the type of film formed on the substrate (S50). Specifically, the controller 190 may control the magnitude of the first pressure to be provided to the first vacuum holes 131 in the first areas 11a and 11b based on the thickness of the substrate. Also, the controller 190 may control the magnitude of the second pressure to be provided to the second vacuum holes 132 in the second areas 12a, 12b, and 12c based on the type of film formed on the substrate.

Although the present disclosure has been described above in relation to the above-mentioned exemplary embodiments thereof, the present disclosure may be modified or changed in various ways without departing from the gist and scope of the disclosure. Therefore, such modifications or changes belong to the scope of the attached claims as long as the modifications or changes belong to the gist of the present disclosure.

What is claimed is:

1. An apparatus for processing a substrate, the apparatus comprising:
 a levitation stage transferring a substrate in a first direction and including first areas and second areas, which are arranged in a second direction that is different from the first direction;
 a plurality of rollers installed in the first areas and transferring the substrate;
 a plurality of first vacuum holes installed in the first areas and configured to suck air at first pressure; and
 a plurality of second vacuum holes installed in the second areas and configured to suck air at second pressure that is different from the first pressure,
 wherein the levitation stage comprises an in-stage on which the substrate is introduced the first areas and the second areas are arranged in the in-stage, two of the second areas are arranged on both sides of one of the first areas in the second direction, and two of the second areas are arranged at both ends of the in-stage in the second direction.

2. The apparatus of claim 1, wherein the air is sucked through the plurality of first vacuum holes at a different-magnitude of the first pressure varied depending on a thickness of the substrate.

3. The apparatus of claim 1, wherein the air is sucked through the plurality of second vacuum holes at a magnitude of the second pressure varied depending on a type of film formed on the substrate.

4. The apparatus of claim 1, wherein the plurality of first areas are arranged to be alternated with the second areas are along the second direction.

5. The apparatus of claim 4, further comprising:
 a first valve module connected to the plurality of first vacuum holes installed in the first areas,
 wherein
 the first valve module includes a plurality of first valves which are arranged in parallel to each other,
 one of the plurality of first valves is used for a substrate having a first thickness, and
 another one of the plurality of first valves is used for a substrate having a second thickness different from the first thickness.

6. The apparatus of claim 4, further comprising:
 a plurality of second valve modules connected to the plurality of second vacuum holes installed in the second areas,
 wherein
 each of the second valve modules includes a plurality of second valves, which are arranged in parallel to each other.

7. The apparatus of claim 6, further comprising:
 a third valve module connected to the second valve modules,
 wherein the third valve module includes a plurality of third valves, which are arranged in parallel to each other.

8. The apparatus of claim 1, further comprising:
 a plurality of first spray holes installed in the first areas and spraying compressed air; and
 a plurality of second spray holes installed in the second areas and spraying compressed air.

9. The apparatus of claim 1, wherein
 the levitation stage further includes a precision stage, on which the substrate is processed.

10. An apparatus for processing a substrate, the apparatus comprising:
 a levitation stage transferring a substrate in a first direction and including first areas and second areas, which are alternately arranged in a second direction that is different from the first direction;
 a plurality of rollers installed in the first areas and transferring the substrate;
 a plurality of first vacuum holes installed in the first areas and sucking air at first pressure;

a plurality of first spray holes installed in the first areas and spraying compressed air;
a plurality of second vacuum holes installed in the second areas and sucking air at second pressure;
a plurality of second spray holes installed in the areas and spraying compressed air; and
a controller programmed to control a magnitude of the first pressure depending on a thickness of the substrate and control a magnitude of the second pressure depending on a type of film formed on the substrate.

11. The apparatus of claim 10, further comprising:
a first valve module connected to the first vacuum holes installed in the first areas,
wherein
the first valve module includes a plurality of first valves, which are arranged in parallel to each other.

12. The apparatus of claim 10, further comprising:
a plurality of second valve modules connected to the second vacuum holes installed in the second areas; and
a third valve module connected to the second valve modules,
wherein
each of the second valve modules includes a plurality of second valves, which are arranged in parallel to each other, and
the third valve module includes a plurality of third valves which are arranged in parallel to each other.

13. The apparatus of claim 10, wherein if the substrate warps upwardly so that a center area of the substrate is positioned higher than edge areas of the substrate, second vacuum holes installed in a second area around the center area of the substrate suck air at a higher pressure than second vacuum holes installed in second areas around the edge areas of the substrate.

14. The apparatus of claim 10, wherein if the substrate warps downwardly so that edge areas of the substrate are positioned higher than a center area of the substrate, second vacuum holes installed in second areas around the edge areas of the substrate suck air at a higher pressure than second vacuum holes installed in a second area around the center area of the substrate.

15. The apparatus of claim 10, wherein
the levitation stage includes an in-stage, on which the substrate is introduced, and a precision stage, on which the substrate is processed, and
the first areas and the second areas are installed on the in-stage.

16. The apparatus of claim 10, wherein the controller is configured to receive a unique identifier of the substrate from an indexer, and control the first and second pressures according to the identifier.

17. The apparatus of claim 10, wherein the levitation stage is installed in an air floating coater.

* * * * *